(12) United States Patent
Yang et al.

(10) Patent No.: US 6,423,554 B2
(45) Date of Patent: Jul. 23, 2002

(54) SEMICONDUCTOR DEVICE HAVING A CAPACITOR AND METHOD FOR THE MANUFACTURE THEREOF

(75) Inventors: Bee-Lyong Yang; Seaung-Suk Lee; Suk-Kyoung Hong; Nam-Soo Kang, all of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/739,371

(22) Filed: Dec. 19, 2000

(30) Foreign Application Priority Data

Dec. 30, 1999 (KR) ............................. 99-65831

(51) Int. Cl.⁷ ................... H01L 21/00; H01L 21/8242; H01L 21/20
(52) U.S. Cl. ..................... 438/3; 438/253; 438/396; 438/643
(58) Field of Search .................. 438/3, 253, 396, 438/643, 239, 240, 241

(56) References Cited

U.S. PATENT DOCUMENTS 5,923,970 A * 7/1999 Kirlin et al. ............. 438/240
6,130,103 A * 10/2000 Cuchiaro et al. ............. 438/3
6,180,971 B1 * 1/2001 Maejima et al. ............. 257/295
6,201,271 B1 * 3/2001 Okutoh et al. ............. 257/295
6,218,197 B1 * 4/2001 Kasai et al. ............. 438/3
6,238,933 B1 * 5/2001 Sun et al. ............. 438/3
6,326,671 B1 * 12/2001 Nagano et al. ............. 257/486

* cited by examiner

Primary Examiner—Alexander G. Ghyka
(74) Attorney, Agent, or Firm—Jacobson Holman, PLLC

(57) ABSTRACT

A semiconductor device for use in a memory cell including an active matrix provided with a transistor and a first insulating layer formed around the transistor; a capacitor structure formed on top of the first insulating layer, composed of a bottom electrode, a capacitor thin film placed on top of the bottom electrode and a top electrode formed on top of the capacitor thin film; a second insulating layer formed on top of the transistor and the capacitor structure; a metal interconnection formed on top of the second insulating layer and the active matrix to electrically connect the transistor to the capacitor structure; and a hydrogen barrier layer formed on top of the metal interconnection.

8 Claims, 5 Drawing Sheets

US 6,423,554 B2

SEMICONDUCTOR DEVICE HAVING A CAPACITOR AND METHOD FOR THE MANUFACTURE THEREOF

FIELD OF THE INVENTION

The present invention relates to a semiconductor device; and, more particularly, to a semiconductor device having a capacitor structure for use in a memory cell and a method for the manufacture thereof.

DESCRIPTION OF THE PRIOR ART

As is well known, a dynamic random access memory (DRAM) with a memory cell comprised of a transistor and a capacitor has a higher degree of integration mainly by down-sizing through micronization. However, there is still a demand for downsizing the area of the memory cell.

To meet this demand, several methods have been proposed, such as a trench type or a stack type capacitor, which is arranged three-dimensionally in a memory device to reduce the cell area available to the capacitor. However, the process of manufacturing a three-dimensionally arranged capacitor is a long and tedious one and consequently incurs high manufacturing costs. Therefore, there is a strong demand for a new memory device that can reduce the cell area while securing a requisite volume of information without requiring complex manufacturing steps.

DRAM devices employ a high dielectric material as a capacitor thin film, such as barium strontium titanate (BST) and tantalum oxide ($Ta_2O_5$), to meet the demand. While DRAM is small, inexpensive, fast, and expends little power, DRAM memory has problems in that it is volatile and has to be refreshed many times each second.

In an attempt to solve the above problem of DRAM, there have been proposed a ferroelectric random access memory (FeRAM) where a capacitor thin film with ferroelectric properties such as strontium bismuth tantalate (SBT) and lead zirconate titanate (PZT) is used for a capacitor in place of a conventional silicon oxide film or a silicon nitride film. FeRAM has a non-volatile property due to remnant polarization of a ferroelectric material and it can operate at lower voltages.

In manufacturing a memory device such as DRAM and FeRAM, there is a step of forming a passivation layer on top of a metal interconnection layer, for protecting the semiconductor device from exposure to detrimental environmental factors such as moisture, particles or the like. The passivation layer is formed by using a method such as plasma enhanced chemical vapor deposition (PECVD) in hydrogen rich ambient. However, during the passivation process, the hydrogen gas generated by the PECVD process degrades the capacitor of the memory cell. That is, the hydrogen gas and ions penetrate to a top electrode and a side of the capacitor, reaching to the capacitor thin film and reacting with oxygen atoms constituting the ferroelectric material of the capacitor thin film. These problems, therefore, tend to make it difficult to obtain the desired reproducibility, reliability and yield in fabricating the memory cell.

SUMMARY OF THE INVENTION

It is, therefore, an object of the present invention to provide a semiconductor device incorporating therein a double hydrogen barrier layer provided with a titanium (Ti) layer and a tetra-ethyl-ortho-silicate (TEOS) oxide layer to protect a capacitor from hydrogen damage after forming a metal interconnection.

It is another object of the present invention to provide a method for manufacturing a semiconductor device incorporating the double hydrogen barrier layer therein to protect a capacitor from hydrogen damage during the formation of a passivation layer.

In accordance with one aspect of the present invention, there is provided a semiconductor device for use in a memory cell, including: an active matrix provided with a transistor and a first insulating layer formed around the transistor; a capacitor structure, formed on top of the first insulating layer, composed of a bottom electrode, a capacitor thin film placed on top of the bottom electrode and a top electrode formed on top of the capacitor thin film; a second insulating layer formed on top of the transistor and the capacitor structure; a metal interconnection formed on top of the second insulating layer and the active matrix to electrically connect the transistor to the capacitor structure; and a hydrogen barrier layer formed on top of the metal interconnection.

In accordance with another aspect of the present invention, there is provided a method for manufacturing a semiconductor device for use in a memory cell, the method comprising steps of: a) preparing an active matrix provided with a transistor and a first insulating layer formed around the transistor; b) forming a capacitor structure on top of the first insulating layer, with the capacitor structure including a capacitor thin film made of a ferroelectric material; c) forming a second insulating layer on top of the capacitor and transistor structure; d) forming a metal interconnection layer and patterning the metal interconnection into a predetermined configuration to electrically connect the transistor to the capacitor structure; and e) forming a hydrogen barrier layer on top of the metal interconnection.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
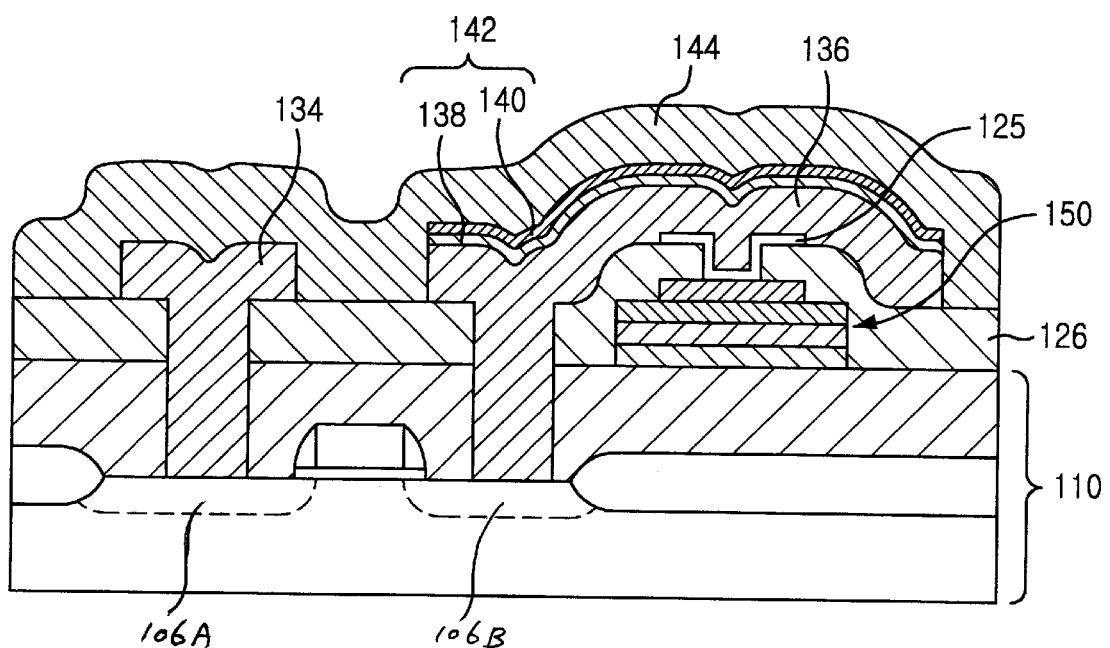
FIG. 1 is a cross sectional view setting forth a semiconductor device in accordance with a preferred embodiment of the present invention.

There are provided in FIG. 1 and FIGS. 2A to 2G cross sectional views of a semiconductor device 100 for use in a memory cell and cross sectional views setting forth a method for the manufacture thereof in accordance with a preferred embodiment of the present invention. It should be noted that like parts appearing in FIG. 1 and FIGS. 2A to 2G are represented by like reference numerals.

In FIG. 1, there is provided a cross sectional view of the inventive semiconductor device 100 including an active matrix 110, a capacitor structure 150, a second insulating layer 126, a bit line 134, a metal interconnection 136, and a double hydrogen barrier layer 142 provided with a tetra-ethyl-ortho-silicate (TEOS) $SiO_2$ layer 138 and a Ti metal layer 140.

In addition, a passivation layer 144 is formed on top of the bit line 134, the Ti metal layer 140 and the second insulating layer 126 by using a plasma enhanced chemical vapor deposition (PECVD) technique, which is carried out at high temperature, e.g., 320 to 400° C., in hydrogen rich ambient. In the semiconductor device 100, the bit line 134 is electrically connected to a diffusion region 106A and a top electrode of the capacitor structure 150 is electrically connected to another diffusion region 106B through the metal interconnection 136, wherein the bit line 134 and the metal interconnection 136 are electrically disconnected from each other. A bottom electrode of the capacitor structure 150 may be connected to a plate line (not shown) to apply a common constant potential thereto. Further, between the bottom and the top electrodes, there is a capacitor thin film made of a ferroelectric material such as SBT (SrBiTaO$_x$), PZT (PbZrTiO$_x$) or the like. Here, a reference numeral 125 denotes a TiN adhesion layer formed on the top electrode, for enhancing the connection between the top electrode and the metal interconnection 136. Here, the double hydrogen barrier 142 layer plays a role in preventing the capacitor of the semiconductor device 100 from being degraded by hydrogen penetration thereinto, because the diffusion velocities of hydrogen atoms markedly decrease in Ti metal.

FIGS. 2A to 2G are schematic cross sectional views setting forth the method for manufacture of a semiconductor memory device 100 in accordance with the preferred embodiment of the present invention.

Figure 2A:
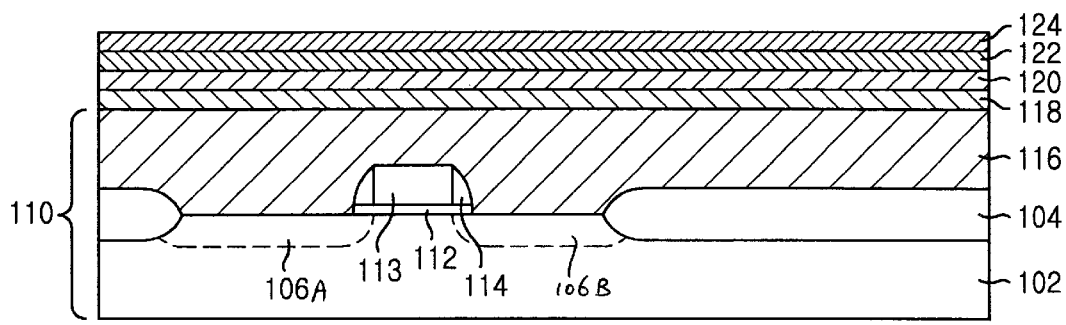
FIGS. 2A to 2G are schematic cross sectional views setting forth a method for the manufacture of the semiconductor memory device in accordance with the present invention.

The process for manufacturing the semiconductor device 100 begins with the preparation of an active matrix 110 including a semiconductor substrate 102, an isolation region 104, diffusion regions 106A, 106B a gate oxide 112, a gate line 113, a spacer 114 and a first insulating layer 116, as shown in FIG. 2A. One of the diffusion regions serves as a source and the other diffusion region serves as a drain. The first insulating layer 116 is made of a material such as boron-phosphor-silicate glass (BPSG) or medium temperature oxide (MTO) or the like.

Thereafter, a buffer layer 118, e.g., made of Ti or TiO$_x$, is formed on top of the first insulating layer 116 with a thickness ranging from 50 to 250 nm. A first metal layer 120, a dielectric layer 122 and a second metal layer 124 are substantially formed on top of the buffer layer 118. In the preferred embodiment, the dielectric layer 122 is made of a ferroelectric material such as strontium bismuth tantalate (SBT), lead zirconate titanate (PZT) or the like and is formed by using a method such as a spin coating, or a chemical vapor deposition (CVD).

Figure 2B:
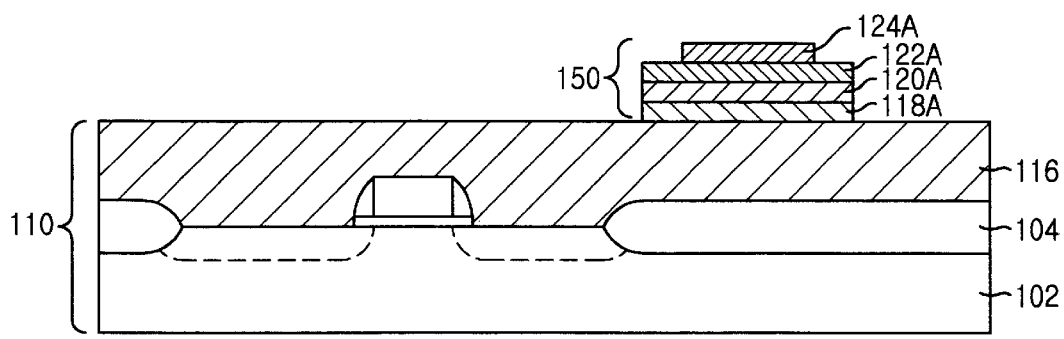

In an ensuing step as shown in FIG. 2B, the second metal layer 124 is patterned into a first predetermined configuration to obtain a top electrode 124A and a capacitor thin film 122A. The dielectric layer 122, the first metal layer 120 and the buffer layer 118 are then patterned into a second predetermined configuration to obtain a capacitor thin film 122A and a bottom electrode structure, thereby forming a capacitor structure 150 having a buffer 118A, a bottom electrode 120A, a capacitor thin film 122A and a top electrode 124A. It is preferable that the bottom electrode 120A have a size different from that of the top electrode 124A in order to form a plate line (not shown) during the following processes.

Figure 2C:
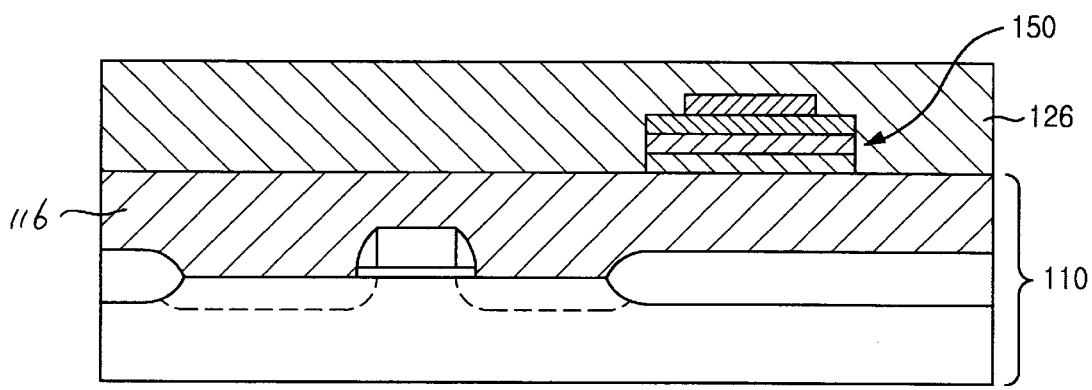
Figure 2D:
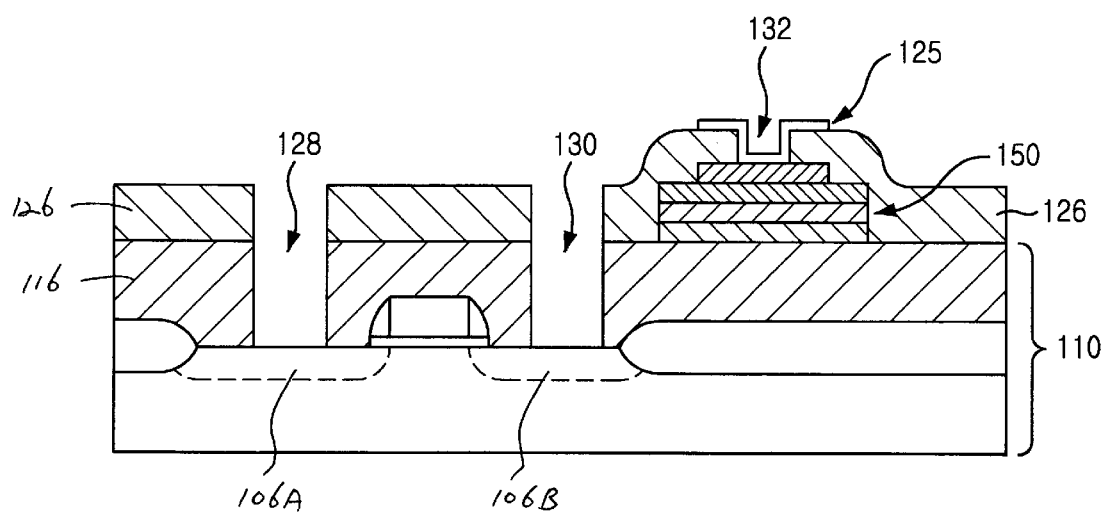

In a next step as shown in FIG. 2C, a second insulating layer 126, made of a material such as BPSG, MTO or double layer consisting of BPSG and tetra-ethyl-ortho-silicate (TEOS)-based oxide, is formed on top of the capacitor structure 150 and the first insulating layer 116 by using a method such as CVD. The second insulating layer 126 is flattened by means of a BPSG flow process or chemical mechanical polishing (CMP), as shown in FIG. 2C.

Figure 2E:
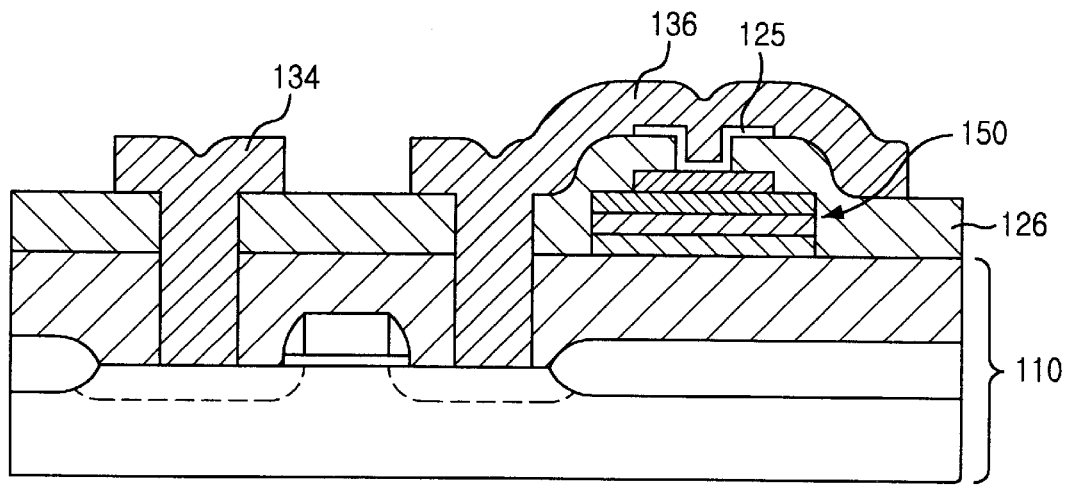

In an ensuing step, a first opening 128 and a second opening 130 are formed at positions over the diffusion regions 106A, 106B through the second and the first insulating layers, 126, 116 respectively, by using a method such as a photolithography and a plasma etching, e.g., reactive ion etching (RIE). A third opening 132 is formed at a position over the capacitor structure 150 through the second insulating layer 126 by using a method such as photolithography and plasma etching. Finally, a TiN layer 125 is formed on the top electrode 124A of the capacitor structure 150 through the third opening 132, for enhancing the connection between the top electrode 124A and a metal interconnection 136, as shown in FIG. 2E. But, the TiN layer 125 may be omitted.

Figure 2F:
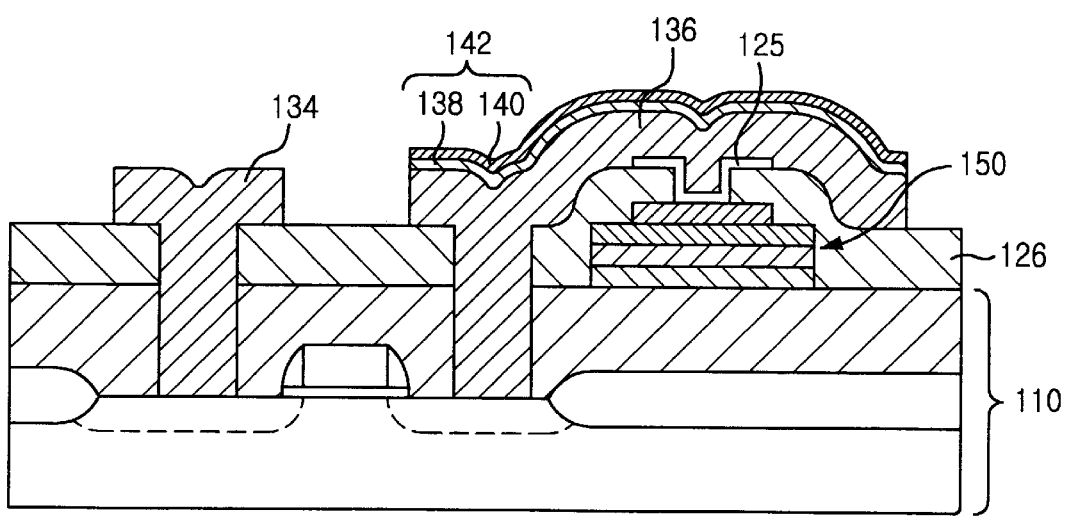
Figure 2G:
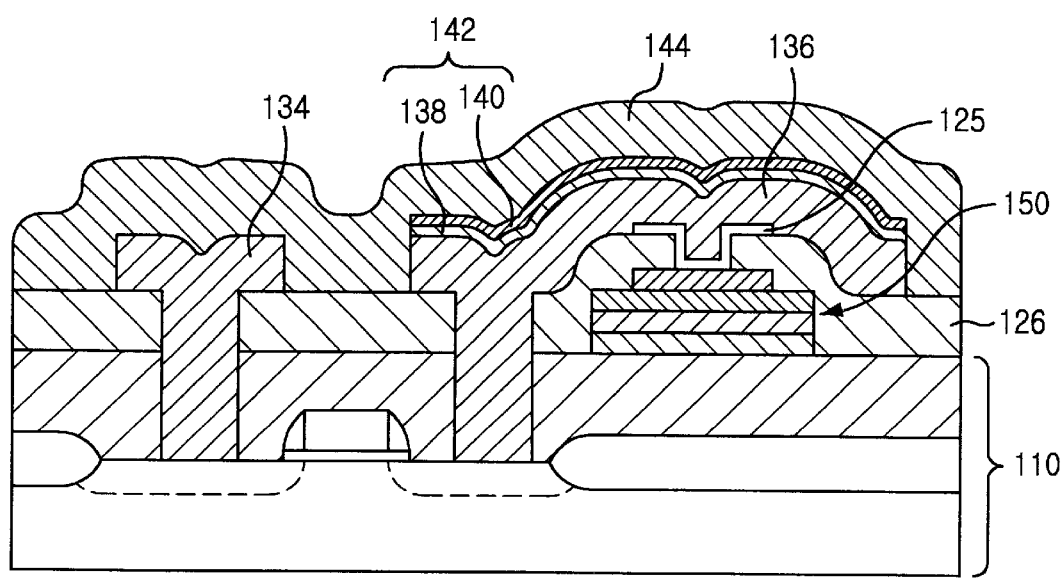

Thereafter, the metal interconnection layer 136, which may be made of Ti/Ti/Al, is formed over the entire surface including the interiors of the openings 128, 130, 132 and is patterned into a third configuration to form a bit line 134 and a metal interconnection 136, as shown in FIG. 2E. A TEOS-SiO$_2$ layer 138 and a Ti metal layer 140 are then formed on top of the metal interconnection 136, and patterned into the third predetermined configuration, as shown in FIG. 2F. Here, the TEOS-SiO$_2$ layer 138 and the Ti metal layer 140 are formed by using a method such as CVD or PVD, wherein the thickness of the TEOS-SiO$_2$ layer 138 and the Ti metal layer 140 are at least 50 nm and 20 nm, respectively. It is noted that the double hydrogen barrier layer 142 should cover the capacitor structure sufficiently to protect the capacitor structure 150 effectively from hydrogen damage induced from a post passivation process.

Finally, a passivation layer 144, which may be made of an undoped silicate glass (USG) and Si$_3$N$_4$, is formed on top of the metal interconnection 136 and the second insulating layer 126 by using a method such as PECVD to protect the semiconductor device 100 from exposure to detrimental environmental factors such as moisture, particles or the like, as shown in FIG. 2F. This passivation process is carried out at a high temperature, e.g., 320–400° C., in hydrogen rich ambient.

By structuring the semiconductor device 100 of the present invention as aforementioned, it is possible to prevent the capacitor structure 150 from being damaged by hydrogen penetration thereinto. That is, by means of the formation of the double hydrogen barrier layer 142 provided with the TEOS-SiO$_2$ layer 138 and the Ti metal layer 140, hydrogen damage is effectively avoided because diffusion velocities of hydrogen atoms are remarkably decreased in the Ti metal.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, the method comprising the steps of:

a) preparing an active matrix provided with a transistor and a first insulating layer formed around the transistor;

b) forming a capacitor structure on top of the first insulating layer, wherein the capacitor structure includes a capacitor thin film made of a ferroelectric material;

c) forming a second insulating layer on top of the capacitor and transistor structure;

d) forming a metal interconnection layer and patterning the metal interconnection into a predetermined configuration to electrically connect the transistor to the capacitor structure; and e) forming a hydrogen barrier layer on top of the metal interconnection.

2. The method of claim 1, further comprising a step of C-1) forming a TiN adhesion layer on top of the capacitor structure for connecting the metal interconnection layer to a top electrode of said capacitor structure.

3. The method of claim 1, further comprising a step of e-1) forming a passivation layer on top of the metal interconnection layer by using a plasma enhanced CVD in a hydrogen rich atmosphere.

4. The method of claim 1, wherein the hydrogen barrier layer is formed in a double layer including a TEOS-SiO$_2$ layer and a Ti metal layer.

5. The method of claim 4, wherein a thickness of the TEOS-SiO$_2$ layer is at least 50 nm.

6. The method of claim 4, wherein a thickness of the Ti metal layer is at least 20 nm.

7. The method of claim 1, wherein the hydrogen barrier layer covers the capacitor structure sufficiently to protect the device from hydrogen damage.

8. The method of claim 1, wherein the capacitor thin film is made of a ferroelectric material selected from a group consisting of SBT (SrBiTaO$_x$) and PZT (PbZrTiO$_x$).

* * * * *